United States Patent
Horiuchi et al.

(10) Patent No.: US 7,910,892 B2
(45) Date of Patent: Mar. 22, 2011

(54) METHOD FOR MANUFACTURING X-RAY DETECTOR AND X-RAY DETECTOR

(75) Inventors: Hiroshi Horiuchi, Otawara (JP); Hiroshi Aida, Otawara (JP)

(73) Assignees: Kabushiki Kaisha Toshiba, Tokyo (JP); Toshiba Electron Tubes & Devices Co., Ltd., Tochigi-ken (JP)

( * ) Notice: Subject to any disclaimer, the term of this patent is extended or adjusted under 35 U.S.C. 154(b) by 526 days.

(21) Appl. No.: 11/641,696

(22) Filed: Dec. 20, 2006

(65) Prior Publication Data

US 2008/0035849 A1 Feb. 14, 2008

(30) Foreign Application Priority Data

Dec. 22, 2005 (JP) ................. 2005-369494

(51) Int. Cl.
*G01T 1/20* (2006.01)
(52) U.S. Cl. ............... 250/370.11; 250/361 R
(58) Field of Classification Search .............. 250/361 R, 250/370.11
See application file for complete search history.

(56) References Cited

U.S. PATENT DOCUMENTS

| | | | | |
|---|---|---|---|---|
| 6,707,066 B2* | 3/2004 | Morishita | ........................ | 257/59 |
| 2001/0045522 A1 | 11/2001 | Homme et al. | | |
| 2003/0001101 A1 | 1/2003 | Homme et al. | | |
| 2003/0107001 A1 | 6/2003 | Baumgartner et al. | | |
| 2003/0127600 A1 | 7/2003 | Vafi et al. | | |
| 2004/0178350 A1* | 9/2004 | Nagano et al. | ........... | 250/370.11 |
| 2006/0033040 A1* | 2/2006 | Okada et al. | ............... | 250/484.2 |

FOREIGN PATENT DOCUMENTS

| | | |
|---|---|---|
| EP | 1 607 768 A1 | 12/2005 |
| JP | 2002-048872 | 2/2002 |
| WO | WO 2004/079396 A1 | 9/2004 |

OTHER PUBLICATIONS

Japanese Office Action dated Nov. 28, 2007 for Appln. No. 2006-131830.
European Search Report dated May 3, 2007 for Appn. No. 06126880.1-1235.

* cited by examiner

*Primary Examiner* — David P Porta
*Assistant Examiner* — Mindy Vu
(74) *Attorney, Agent, or Firm* — Pillsbury Winthrop Shaw Pittman, LLP

(57) ABSTRACT

A first protective layer is formed on the surface of a photoelectric conversion substrate on which photoelectric transducers have been provided, and then, a scintillator layer is formed thereon, whereby degradation of the photoelectric transducers due to the contact with the scintillator layer is prevented. A second protective layer covering the surface of the scintillator is formed. A peripheral part of the first protective layer is allowed to be in close contact with a peripheral part of the second protective layer to seal the scintillator layer between the first protective layer and the second protective layer, whereby degradation of the scintillator layer due to the moisture in the atmospheric air is prevented.

3 Claims, 4 Drawing Sheets

METHOD FOR MANUFACTURING X-RAY DETECTOR AND X-RAY DETECTOR

CROSS-REFERENCE TO RELATED APPLICATIONS

This application is based upon and claims the benefit of priority from prior Japanese Patent Application No. 2005-369494, filed Dec. 22, 2005, the entire contents of which are incorporated herein by reference.

BACKGROUND OF THE INVENTION

1. Field of the Invention

The present invention relates to a method for manufacturing an X-ray detector for detecting X-ray and the X-ray detector manufactured thereby.

2. Description of the Related Art

A flat X-ray detector using an active matrix has been attracting attention as a new-generation X-ray diagnostic image detector. In this type of the X-ray detector, when X-ray is irradiated on an object, an X-ray photographed image or a real-time X-ray image of the object is output as digital image signals. Since the X-ray detector is a solid detector, it is extremely expected in terms of image quality performance and stability so that a great amount of research and development has been progressed.

As the first use of practical application, such X-ray detector has been developed and commercialized recently for photographing a chest region or a general purpose photograph in order to collect still images with the use of a comparatively large dose. Commercialization of such X-ray detector is expected in immediate future for applications in fields of circulatory organs and digestive organs in which the realization of a real-time moving image having a higher performance and displayed by thirty or more frames per second under the fluoroscopy dose is required. In the use application of such moving image, improvements in S/N ratio, a real-time processing technology for very small signals and the like are important items to be developed.

In the meantime, X-ray detectors are classified broadly into two types of technique, i.e. a direct technique and an indirect technique. The direct technique is such that X-ray is converted directly into electric charge signals by means of a photoconducting film such as a-Se, and the signals are guided to a capacitor for accumulating electric charge. In the direct technique, since the photoconductive electric charge produced by the X-ray is guided directly to the capacitor for accumulating electric charge due to a high electric field, the resolution characteristic defined substantially by pitches of the picture electrodes of an active matrix is obtained. On the other hand, the indirect technique is such that X-ray is once converted into a visible light with a scintillator layer, and the visible light is converted into signal electric charges by means of a photoelectric transducer such as an a-Si photodiode and a CCD to guide the signal electric charges to a capacitor for accumulating electric charge. Accordingly, degradation arises in the resolution characteristic due to optical diffusion and scattering appearing before the visible light from the scintillator layer reaches the photodiode or the CCD.

In the X-ray detector of the indirect technique generally, the characteristics of a scintillator layer become important from the structural point of view. In order to elevate the output signal intensity with respect to the X-ray input, there are many cases in which a high-luminance fluorescent material composed of, for example, a halide such as cesium iodide (CsI) or an oxide-based compound such as sulfated gadolinium (GOS) is used for the scintillator layer. Furthermore, there are generally many cases in which a high-density scintillator layer is formed uniformly on a circuit board on which a plurality of photoelectric transducers have been provided in accordance with a vapor growth method such as vacuum deposition method, sputtering technique, and CVD method.

However, when a halide such as CsI being a high-luminance fluorescent material is used in the scintillator layer, since the reactivity of a halogen element such as iodine is high, the halide reacts with an electropositive element in the photoelectric transducer being in contact with the scintillator layer, and the halide reacts with the moisture in the atmospheric air, whereby the scintillator layer deliquesces. As a result, there arise problems of degradations in a variety of characteristics and the reliability of an X-ray detector, decrease in the productivity and increase in the production cost of such X-ray detector.

In this connection, an X-ray detector of the indirect technique intends to form a uniform scintillator layer in which a transparent layer of polyimide is formed on the surface of a circuit board on which photoelectric transducers have been arrayed, and a scintillator layer is formed on the transparent layer, whereby corrosion of the photoelectric transducers is prevented. In addition, a protective layer of polyparaxylilene for covering the scintillator layer to seal it closely is provided, whereby the scintillator layer is protected against the deliquescence due to the moisture in the atmospheric air (e.g. Jpn. Pat. Appln. KOKAI Publication No. 2002-48872 (page 3, FIGS. 1-3)).

However, since the peripheral part of the protective layer covering the scintillator layer is joined to a circuit board or the like made of a different material, there still remain such problems that a joint strength in the interface of the protective layer and a member made of a different material decreases easily, and further that the protective layer exfoliates due to a stress generated by a difference in coefficients of thermal expansion between the protective layer and the member made of the different material, whereby sealing property of the scintillator layer is damaged.

BRIEF SUMMARY OF THE INVENTION

An object of the present invention is to provide a method for manufacturing an X-ray detector and the X-ray detector manufactured thereby in which a scintillator layer can be positively protected.

A method for manufacturing an X-ray detector of the present invention comprises: forming a first protective layer on a surface of a photoelectric conversion substrate on which photoelectric transducers have been provided; forming a scintillator layer on a surface of the first protective layer; and forming a second protective layer composed of the same material as that of the first protective layer so as to cover the surface of the scintillator layer and such that a peripheral part of the second protective layer is allowed to be in close contact with a peripheral part of the first protective layer to seal the scintillator layer between the first protective layer and the second protective layer.

An X-ray detector of the present invention comprises: a photoelectric conversion substrate on a surface of which photoelectric transducers have been provided; a first protective layer formed on the surface of the photoelectric conversion substrate; a scintillator layer formed on a surface of the first protective layer; and a second protective layer composed of the same material as that of the first protective layer so as to cover the surface of the scintillator layer and formed such that a peripheral part thereof is in close contact with a peripheral part of the first protective layer to seal the scintillator layer between the first protective layer and the second protective layer.

According to the present invention, the first protective layer is formed on the surface of the photoelectric conversion substrate on which a plurality of the photoelectric transducers have been arrayed, and then, the scintillator layer is formed on the surface of the first protective layer. As a result, corrosion of the photoelectric transducers due to the contact with the scintillator layer can be prevented. Moreover, the second protective layer is formed so as to cover the surface of the scintillator layer and further such that the peripheral part of the second protective layer is allowed to be in close contact with the peripheral part of the first protective layer to seal the scintillator layer between the first protective layer and the second protective layer. Accordingly, the deliquescence of the scintillator layer due to the moisture in the atmospheric air can be prevented. In addition, since the first protective layer is composed of the identical material to that of the second protective layer, degradation in the joint strength as well as a stress due to the difference in coefficients of thermal expansion in the interface of the joint surface of the first protective layer and the second protective layer can be reduced, whereby a closely sealed condition of the scintillator layer can be positively assured so that the scintillator layer can be positively protected.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

In the following, embodiments of the present invention will be described by referring to the accompanying drawings.

Figure 1:
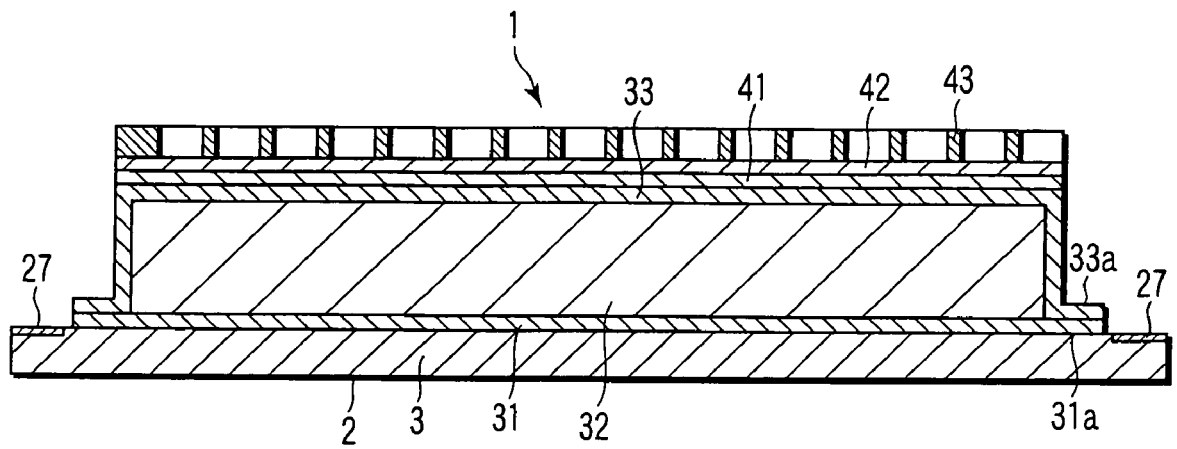
FIG. 1 is a sectional view showing an X-ray detector according to a first embodiment of the present invention.
Figure 2:
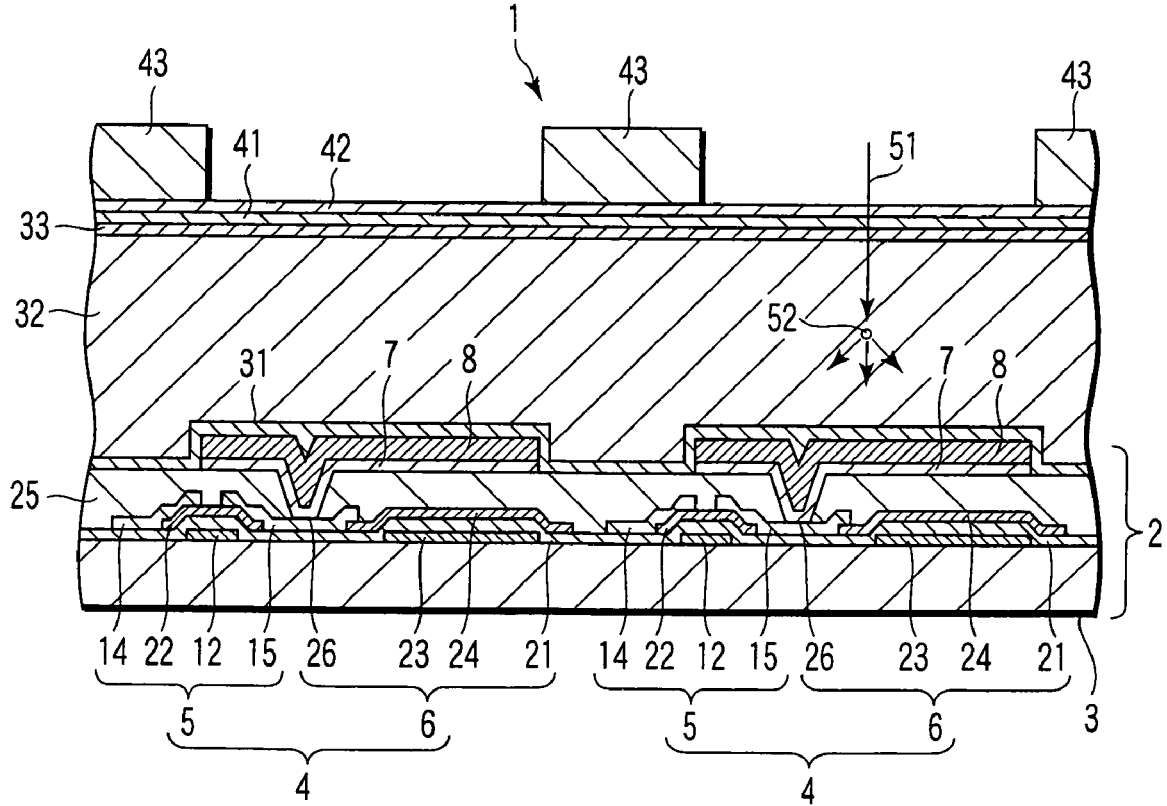
FIG. 2 is a sectional view showing an enlarged part of the X-ray detector of FIG. 1.
Figure 3:
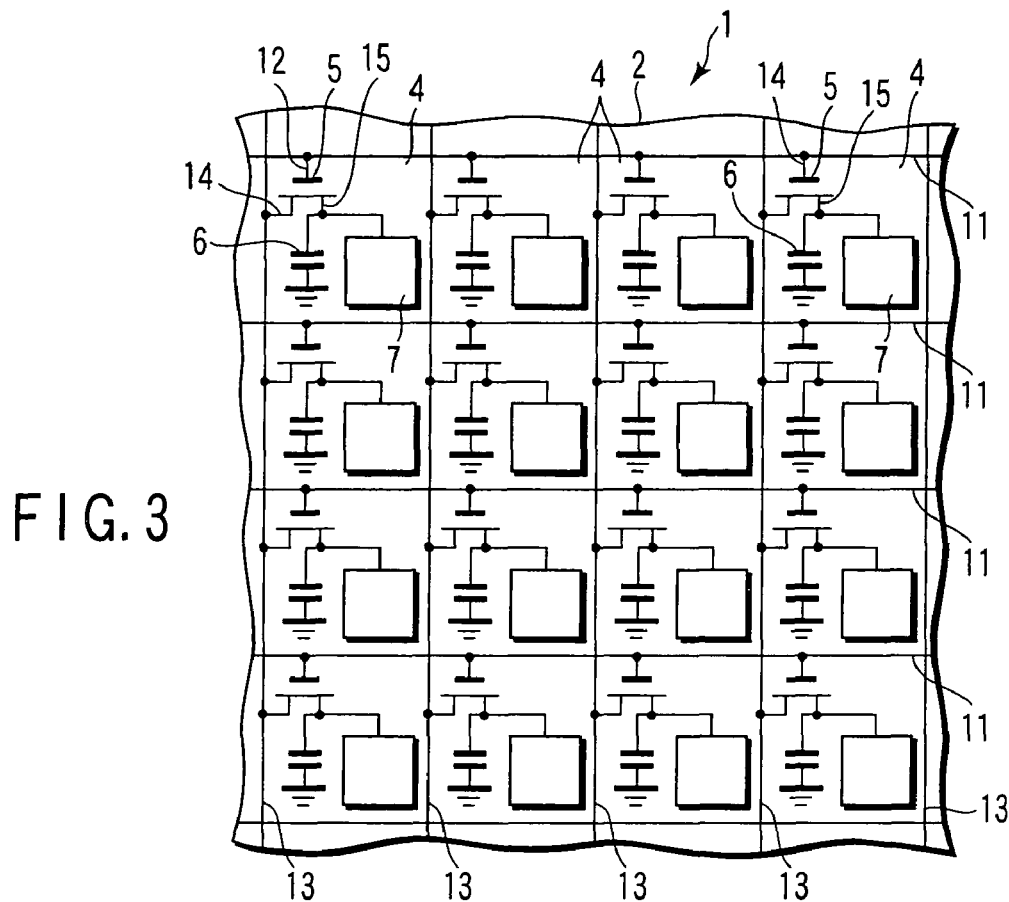
FIG. 3 is a front view showing schematically the X-ray detector of FIG. 1.

A first embodiment of the invention is illustrated in FIGS. 1, 2 and 3 as well as in FIGS. 4A through 4H.

In FIGS. 1 through 3, reference numeral 1 designates an X-ray detector, and the X-ray detector 1 is an X-ray two-dimensional image detector of the indirect technique. The X-ray detector 1 is provided with a photoelectric conversion substrate 2 serving as an active matrix photoelectric conversion substrate for converting a visible light into electrical signals.

The photoelectric conversion substrate 2 is provided with a support substrate 3 functioning as an insulating substrate formed from rectangular flat plate-shaped glass and the like having transmittive property. On the surface of the support substrate 3, a plurality of picture elements 4 are two-dimensionally arrayed in a matrix shape, and a thin film transistor (TFT) 5 functioning as a switching element, a capacitor 6 for accumulating electric charge, a picture electrode 7, and a photoelectric transducer 8 such as a photodiode are formed in every picture element 4.

As shown in FIG. 3, control electrodes 11 are wired on the support substrate 3, and the control electrodes function as a plurality of control lines along the row directions of the support substrate 3. The plurality of these control electrodes 11 are positioned between the respective picture elements 4 on the support substrate 3 and disposed in the column directions of the support substrate 3 apart from one another. A gate electrode 12 of each of the thin film transistors 5 is electrically connected to each of these control electrodes 11.

On the support substrate 3, a plurality of read-out electrodes 13 are wired along the column directions of the support substrate 3. The plurality of these read-out electrodes 13 are positioned between the respective picture elements 4 on the support substrate 3, and disposed in the row directions of the support substrate 3 apart from one another. A source electrode 14 of each of the thin film transistors 5 is electrically connected to each of the plurality of these read-out electrodes 13. Furthermore, a drain electrode 15 of each of the thin film transistors 5 is electrically connected with each of the capacitors 6 for accumulating electric charge and each of the picture electrodes 7.

As shown in FIG. 2, each of the gate electrodes 12 of the thin film transistors 5 is formed on the support substrate 3 in an island shape. Each of insulation films 21 is laminated and formed on the support substrate 3 containing each of the gate electrodes 12. Each of the gate electrodes 12 is covered with each of the insulation films 21. Moreover, each of plural island-shaped semi-insulation films 22 is laminated and formed on each of the insulation films 21. Each of the semi-insulation films 22 is composed of a semiconductor, and functions as a channel region of each of the thin film transistors 5. Each of the semi-insulation films 22 is disposed to be opposed to each of the gate electrodes 12, and covers each of the gate electrodes 12. Namely, each of the semi-insulation films 22 is provided on each of the gate electrodes 12 through each of the insulation films 21.

On each of the insulation films 21 containing each of the semi-insulation films 22, each of island-shaped source electrodes 14 and drain electrodes 15 is formed. These source electrodes 14 are insulated from these drain electrodes 15 with each other, and they are not electrically connected with each other. Furthermore, the source electrode 14 and the drain electrode 15 are disposed on each of the gate electrodes 12 at the opposite ends thereof, and each one end of these source electrodes 14 and drain electrodes 15 is laminated on each of the semi-insulation films 22, respectively.

The gate electrode 12 of each of the thin film transistors 5 is electrically connected to the common control electrodes 11 together with the gate electrode 12 of another thin film transistor 5 positioned on the same row as shown in FIG. 3. Further, the source electrode 14 of each of the thin film transistors 5 is electrically connected to the common read-out electrodes 13 together with the source electrode 14 of another thin film transistor 5 positioned on the same column.

Each of the capacitors 6 for accumulating electric charge is provided with an island-shaped lower electrode 23 formed on the support substrate 3. On the support substrate 3 containing the lower electrodes 23, the insulation films 21 are laminated and formed. Each of the insulation films 21 extends from the upper part of each of the gate electrodes 12 of each of the thin film transistors 5 to the upper part of each of the lower electrodes 23. In addition, on each of the insulation films 21, each island-shaped upper electrode 24 is laminated and formed. Each of the upper electrodes 24 is disposed to be opposed to each of the lower electrodes 23, and covers each of the lower electrodes 23. Namely, each of the upper electrodes 24 is provided on each of the lower electrodes 23 through each of the insulation films 21. On each of the insulation films 21 containing each of the upper electrodes 24, each of the drain electrodes 15 is laminated and formed. The other end of each of the drain electrodes 15 is laminated on each of the upper electrodes 24, whereby each of the drain electrodes 15 is electrically connected with each of the upper electrodes 24.

On each of the insulation films 21 containing each of the semi-insulation films 22, each of the source electrodes 14 and each of the drain electrodes 15 of each of the thin film transistors 5 as well as each of the upper electrodes 24 of each of the capacitors 6 for accumulating electric charge, an insulation layer 25 is laminated and formed. Each of the insulation layers 25 is composed of silicon oxide (SiO$_2$) or the like, and it is formed so as to surround each of the picture electrodes 7.

On a part of the insulation layer 25, a throughhole 26 functioning as a contact hole communicating with each of the drain electrodes 15 of each of the thin film transistors 5 is opened and formed. On each of the insulation layers 25 containing each of the throughholes 26, each island-shaped picture electrode 7 is laminated and formed. Each of the picture electrodes 7 is electrically connected with each of the drain electrodes 15 of each of the thin film transistors 5 by means of each of the throughholes 26.

On each of the picture electrodes 7, each of the photoelectric transducers 8 such as a photodiode for converting a visible light into electrical signals is laminated and formed.

As shown in FIG. 1, on a peripheral part of the surface of the photoelectric conversion substrate 2, an electrical connection part 27 such as a TAB pad, and a bonding pad to which the control electrodes 11 and the read-out electrodes 13 are connected is formed.

Moreover, as shown in FIGS. 1 and 2, a first protective layer 31 is laminated and formed on the surface of the photoelectric conversion substrate 2 on which the photoelectric transducers 8 have been formed, a scintillator layer 32 for converting X-ray into a visible light is formed on the surface of the first protective layer 31, and a second protective layer 33 is laminated and formed so as to cover the whole of the outer surface containing the surface of the scintillator layer 32. A peripheral part 33a of the second protective layer 33 is allowed to be in close contact with a peripheral part 31a of the first protective layer 31, whereby the scintillator layer 32 is completely sealed between the first protective layer 31 and the second protective layer 33.

The first protective layer 31 and the second protective layer 33 are prepared from the same material. The material has insulation performance, moisture vapor cutoff performance, and transparent performance with respect to emission of the scintillator layer 32. Examples of such material include organic materials containing polyparaxylilene as a main component, inorganic materials containing a carbon crystal as a main component, and the like. The first protective layer 31 and the second protective layer 33 are formed in accordance with a vapor growth method such as vacuum deposition method, sputtering technique, and CVD method, and the CVD method is particularly preferred, because this method can provide a film exhibiting high form harmonization.

The scintillator layer 32 is formed in a columnar crystal structure film-formed by depositing a halide such as cesium iodide (CsI) which is a high-luminance fluorescent material, or an oxide-based compound such as sulfated gadolinium (GOS) which is a phosphor in accordance with a vapor deposition method, an electrobeam method, a sputtering method or the like.

Furthermore, a reflection layer 41 for elevating a use efficiency of the visible light converted by the scintillator layer 32 is laminated and formed on the scintillator layer 32, an insulation layer 42 is laminated and formed on the reflection layer 41, and a lattice-shaped X-ray grid 43 for shielding each space defined between the picture elements 4 is formed on the insulation layer 42.

Next, operations of the present embodiment will be described.

First, X-ray 51 incident on the scintillator layer 32 of the X-ray detector 1 is converted into a visible light 52 by means of the scintillator layer 32.

The visible light 52 reaches the photoelectric transducer 8 of the photoelectric conversion substrate 2 to be converted into electric signals. The electric signals converted in the photoelectric transducer 8 flow into the picture electrode 7, the electric signals are moved to the capacitor 6 for accumulating electric charge, which is connected to the picture electrode 7, and maintained to be accumulated until the gate electrode 12 of the thin film transistor 5 connected to the picture electrode 7 comes to be in a driving condition.

At this occasion, when one of the control electrodes 11 is made to in a driving condition, the thin film transistors 5 in one row connected to this control electrode 11 in the driving condition come to be in the driving condition.

Then, the electric signals accumulated in each of the capacitors 6 for accumulating electric charges connected to each of the thin film transistors 5 in the driving condition are output to the read-out electrodes 13.

As a result, since the signals corresponding to the picture elements 4 in a specified row of an X-ray image are output, the signals corresponding to all the picture elements 4 of the X-ray image may be output by means of the control electrode 11, whereby the output signals are converted into digital image signals.

Next, a method for manufacturing the X-ray detector 1 will be described by referring to FIGS. 4A through 4H in this order.

Figure 4A:
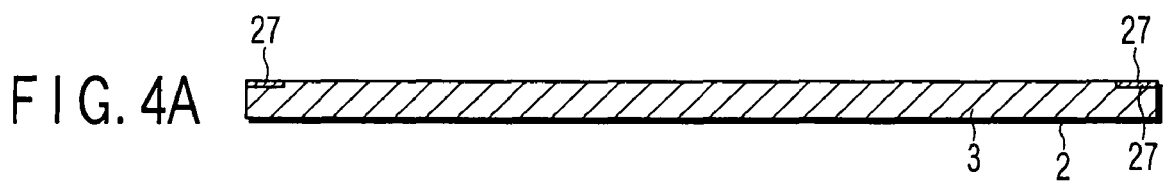
FIG. 4A is a sectional view illustrating a method for manufacturing the X-ray detector of FIG. 1.

As shown in FIG. 4A, the photoelectric conversion substrate 2 on the surface of which a plurality of the photoelectric transducers 8 have been provided is formed.

Figure 4B:
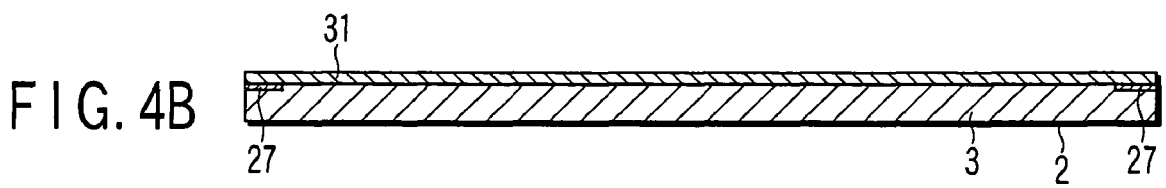
FIG. 4B is a sectional view illustrating the method for manufacturing the X-ray detector of FIG. 1.

As shown in FIG. 4B, the first protective layer 31 is formed, on the entire surface of the photoelectric conversion substrate 2, from an organic material containing polyparaxylilene as a main component, an inorganic material containing a carbon crystal as a main component, and the like in accordance with a vapor growth method such as vacuum deposition method, sputtering technique, and CVD method.

Figure 4C:
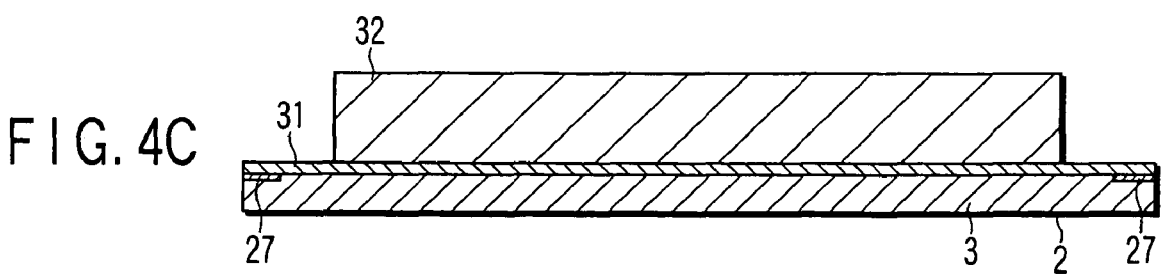
FIG. 4C is a sectional view illustrating the method for manufacturing the X-ray detector of FIG. 1.

As shown in FIG. 4C, the scintillator layer 32 having a columnar crystal structure film-formed by depositing a halide such as cesium iodide (CsI) which is a high-luminance fluorescent material, or an oxide-based compound such as sulfated gadolinium (GOS) which is a phosphor is formed on the surface of the first protective layer 31 within a predetermined area in accordance with a vapor deposition method, an electrobeam method, a sputtering method or the like.

Figure 4D:
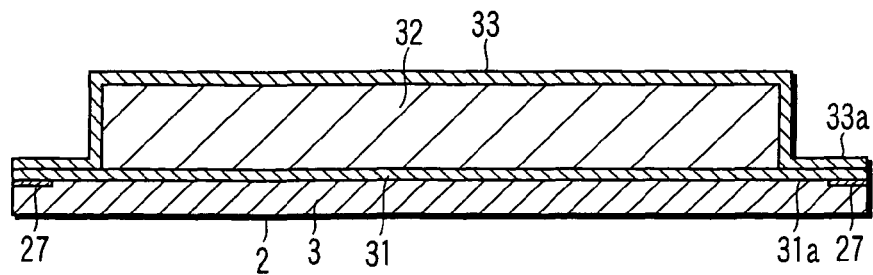
FIG. 4D is a sectional view illustrating the method for manufacturing the X-ray detector of FIG. 1.

As shown in FIG. 4D, the second protective layer 33 is formed from the identical material to that of the first protective layer 31 in accordance with the same manner as that of the first protective layer 31 so as to cover the whole surface thereof including the scintillator layer 32 and the photoelectric conversion substrate 2. Thus, the peripheral part 33a of the second protective layer 33 comes in close contact with the peripheral part 31a of the first protective layer 31, whereby the scintillator layer 32 is completely sealed between the first protective layer 31 and the second protective layer 33.

Figure 4E:
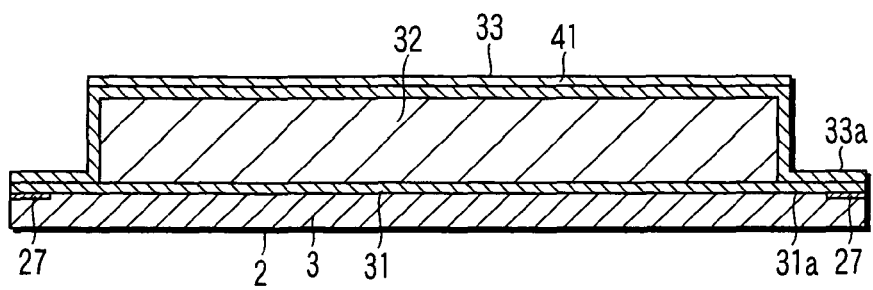
FIG. 4E is a sectional view illustrating the method for manufacturing the X-ray detector of FIG. 1.
Figure 4F:
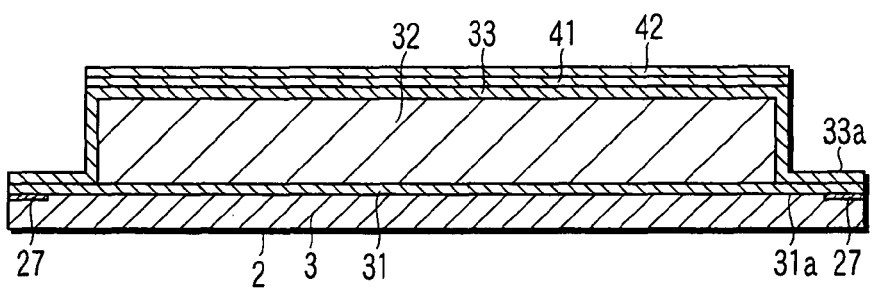
FIG. 4F is a sectional view illustrating the method for manufacturing the X-ray detector of FIG. 1.
Figure 4G:
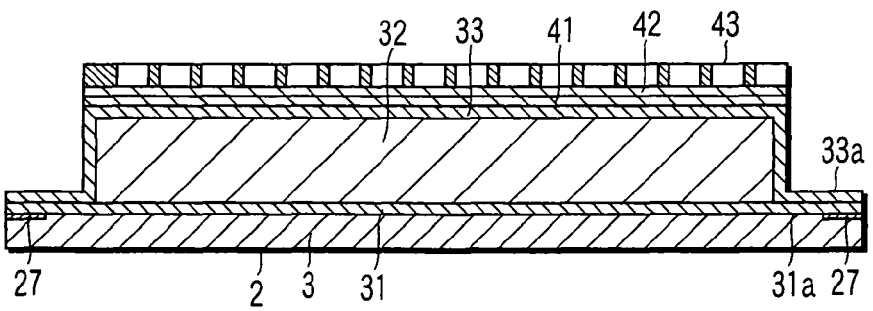
FIG. 4G is a sectional view illustrating the method for manufacturing the X-ray detector of FIG. 1.

As shown in FIGS. 4E, 4F, and 4G, the reflection layer 41, the insulation layer 42, and the X-ray grid 43 are sequentially formed on the surface of the second protective layer 33 so as to correspond to the area of the scintillator layer 32.

Figure 4H:
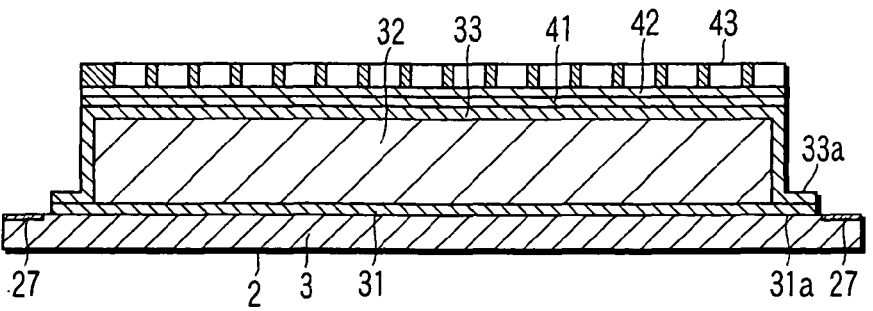
FIG. 4H is a sectional view illustrating the method for manufacturing the X-ray detector of FIG. 1.

As shown in FIG. 4H, when a part of the first protective layer 31 and the second protective layer 33 covering an electrode connection part 27 of the photoelectric conversion substrate 2 is removed, the X-ray detector 1 may be manufactured.

According to the X-ray detector 1 constructed as described above, the first protective layer 31 is formed on the surface of the photoelectric conversion substrate 2 on which a plurality of the photoelectric transducers 8 have been arrayed, and then, the scintillator layer 32 is formed on the surface of the first protective layer 32. Thus, corrosion of the photoelectric transducers 8 due to the contact with the scintillator layer 32 can be prevented, even in the case where a halogen compound such as CsI which is a high-luminance fluorescent material is used for the scintillator layer 32.

Moreover, the second protective layer 33 is formed so as to cover the surface of the scintillator layer 32, and further such that the peripheral part 33a of the second protective layer 32 is allowed to be in close contact with the peripheral part 31a of the first protective layer 31 to seal the scintillator layer 32 between the first protective layer 31 and the second protective layer 33. Accordingly, the deliquescence of the scintillator layer 32 due to the moisture in the atmospheric air can be prevented, whereby degradation in the characteristics of the scintillator layer 32 can be prevented and the reliability thereof can be improved.

In addition, the first protective layer 31 is composed of the identical material to that of the second protective layer 33. Therefore, in comparison with the case where the first protective layer 31 and the second protective layer 33 are made from different materials, degradation in the joint strength as well as a stress due to the difference in coefficients of thermal expansion in the interface of the joint surface of the first protective layer 31 and the second protective layer 33 can be reduced, whereby a closely sealed condition of the scintillator layer 32 can be positively assured, and the scintillator layer 32 can be positively protected.

On one hand, since the first protective layer 31 is formed on the surface of the photoelectric conversion substrate 2 in the manufacturing process of the X-ray detector 1, it becomes possible to planarize the surface of the photoelectric conversion substrate 2, and to protect the electrical connection part 27 disposed in the peripheral part of the photoelectric conversion substrate 2. As a result, it becomes possible to prevent quality failure of the scintillator layer 32 due to the irregularity on the surface of the photoelectric conversion substrate 2, contact of the photoelectric conversion substrate 2 with tools, and damages or the like in the electrical connection part 27 occurring in the case of the transportation or the like thereof, resulting also in the productivity improvements and reduction in the production cost of the X-ray detector 1.

For instance, when the X-ray detector 1 is manufactured specifically in accordance with the following conditions:
high-luminance fluorescent material of the scintillator layer 32: CsI (Tl Dope);
method for forming the scintillator layer 32: vacuum deposition method;
materials constituting the first protective layer 31 and the second protective layer 33: polyparaxylilene;
method for forming the first protective layer 31 and the second protective layer 33: CVD method;
film thickness of the first protective layer 31: 5000 Å; and
film thickness of the second protective layer 33: 5 µm, the scintillator layer 32 exhibits insulative performance, and moisture vapor cutoff performance, and has optical transparency with respect to the emission of the scintillator layer 32. Since the X-ray detector 1 has a structure in which the scintillator layer 32 is sealed by the protective layers 31 and 33 composed of the identical organic material, prevention of degradation in characteristics and improvements in the reliability of the scintillator layer 32; and the productivity improvement and reduction of the production cost of the X-ray detector can be achieved.

Figure 5:
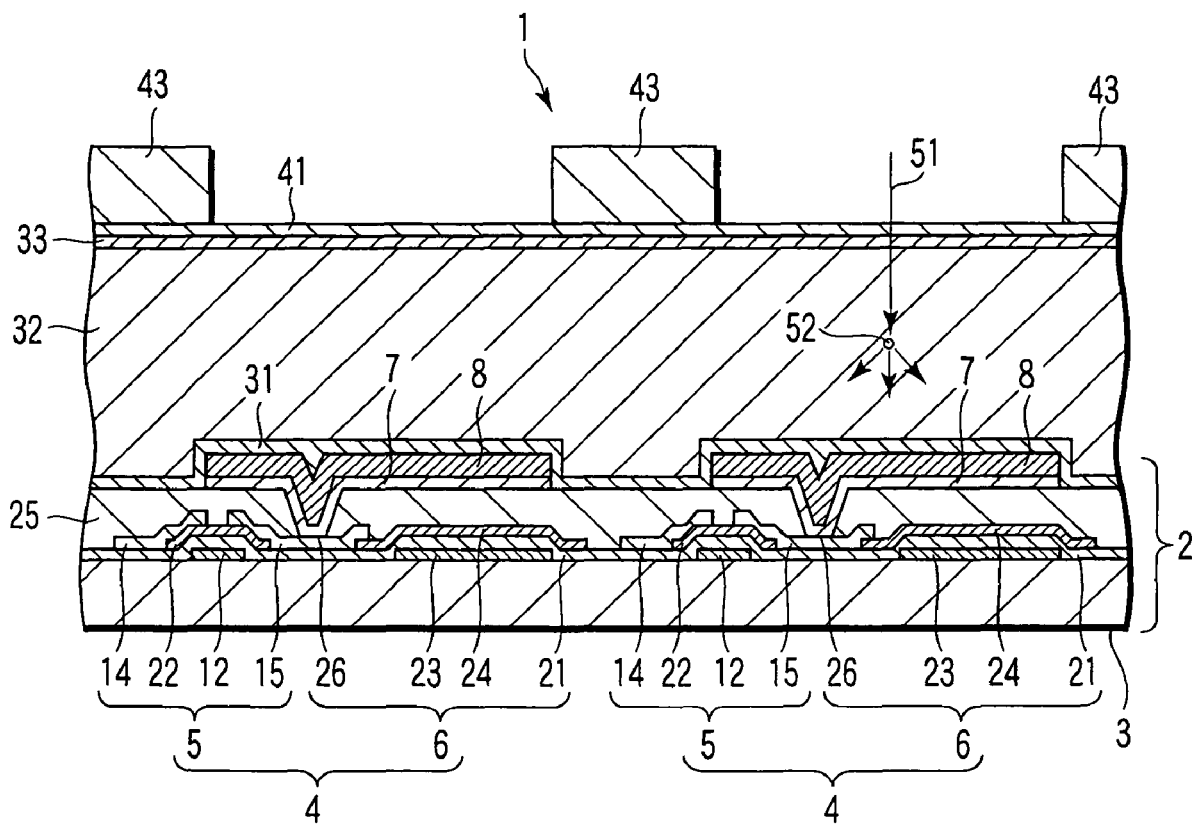
FIG. 5 is a partly enlarged sectional view showing the X-ray detector according to a second embodiment of the present invention.

Furthermore, a second embodiment of the present invention is illustrated in FIG. 5.

A reflection layer 41 is formed on the surface of a scintillator layer 32, and then, a second protective layer 33 is formed so as to cover the scintillator layer 32 including the reflection layer 41.

Also in an X-ray detector 1 of the second embodiment having the construction as described above, the same advantageous effect as the X-ray detector 1 of the first embodiment can be obtained.

Although picture elements 4 are formed two-dimensionally on a photoelectric conversion substrate 2 in a matrix shape, it may be formed one-dimensionally.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing an X-ray detector, comprising:
forming, using vapor phase epitaxy, a first protective layer on a surface of a photoelectric conversion substrate on which photoelectric transducers have been provided, the first protective layer being formed of an organic material or an inorganic material;
forming a scintillator layer on a surface of the first protective layer; and
forming a second protective layer composed of the same material as that of the first protective layer so as to cover the surface of the scintillator layer, such that a peripheral part of the second protective layer is allowed to be in close contact with a peripheral part of the first protective layer to seal the scintillator layer between the first protective layer and the second protective layer, wherein portions of the first and second protective layers which cover an electrode connection part included in the photoelectric conversion substrate are eliminated, and wherein the first and second protective layer have insulation properties, vapor blocking properties, and transmitting light emitted from the scintillator layer properties.

2. A method for manufacturing an X-ray detector, comprising:

forming, using vapor phase epitaxy, a first protective layer on a surface of a photoelectric conversion substrate on which photoelectric transducers have been provided, the first protective layer being formed of an organic material or an inorganic material;

forming a scintillator layer on a surface of the first protective layer; and forming a second protective layer composed of the same material as that of the first protective layer so as to cover the surface of the scintillator layer and such that a peripheral part of the second protective layer is allowed to be in close contact with a peripheral part of the first protective layer to seal the scintillator layer between the first protective layer and the second protective layer, wherein the material constituting the first protective layer and the second protective layer is an organic material containing polyparaxylylene as a main component, and wherein portions of the first and second protective layers which cover an electrode connection part included in the photoelectric conversion substrate are eliminated.

3. A method for manufacturing an X-ray detector, comprising:

forming, using vapor phase epitaxy, a first protective layer on a surface of a photoelectric conversion substrate on which photoelectric transducers have been provided, the first protective layer being formed of an organic material or an inorganic material;

forming a scintillator layer on a surface of the first protective layer; and forming a second protective layer composed of the same material as that of the first protective layer so as to cover the surface of the scintillator layer and such that a peripheral part of the second protective layer is allowed to be in close contact with a peripheral part of the first protective layer to seal the scintillator layer between the first protective layer and the second protective layer;

wherein the material constituting the first protective layer and the second protective layer is an inorganic material containing a carbon crystal as a main component, and wherein portions of the first and second protective layers which cover an electrode connection part included in the photoelectric conversion substrate are eliminated.

* * * * *